United States Patent
Hoffmann

(10) Patent No.: US 7,470,324 B2
(45) Date of Patent: Dec. 30, 2008

(54) PROTEIN CRYSTALLISATION METHOD

(76) Inventor: Kurt Hoffmann, Montenau 87, B-4770, Amel (BE)

( * ) Notice: Subject to any disclaimer, the term of this patent is extended or adjusted under 35 U.S.C. 154(b) by 453 days.

(21) Appl. No.: 10/522,690

(22) PCT Filed: Jul. 29, 2003

(86) PCT No.: PCT/EP03/08369

§ 371 (c)(1),
(2), (4) Date: Aug. 9, 2005

(87) PCT Pub. No.: WO2004/012841

PCT Pub. Date: Feb. 12, 2004

(65) Prior Publication Data

US 2006/0111555 A1      May 25, 2006

(30) Foreign Application Priority Data

Jul. 30, 2002   (EP)  .................................. 02017135
Sep. 1, 2002    (BE)  ................................ 2002/0509
Jan. 16, 2003   (DE)  ................................ 103 01 342

(51) Int. Cl.
     *C30B 29/58*        (2006.01)
(52) U.S. Cl. ......................... 117/68; 117/69; 117/70; 117/925; 117/926; 117/927

(58) Field of Classification Search .................. 117/68, 117/69, 70, 925, 926, 927
See application file for complete search history.

(56) References Cited

U.S. PATENT DOCUMENTS

| | | | | |
|---|---|---|---|---|
| 4,076,846 | A | * | 2/1978 | Nakatsuka et al. ............ 426/62 |
| 5,340,492 | A | * | 8/1994 | Kacher et al. ................ 510/146 |
| 2001/0002261 | A1 | | 5/2001 | Morrison et al. |
| 2006/0090644 | A1 | * | 5/2006 | Sirkar ........................... 95/45 |

FOREIGN PATENT DOCUMENTS

| JP | 07053738 | 2/1995 |
|---|---|---|
| WO | WO 01/88231 A3 | 11/2001 |

OTHER PUBLICATIONS

Mayer et al. Journal of Molecular Biology, 1999, vol. 292, pp. 871-891.*

* cited by examiner

*Primary Examiner*—Robert M Kunemund
(74) *Attorney, Agent, or Firm*—Dardi & Associates, PLLC

(57) ABSTRACT

A method for the crystallization of macromolecules in a three-phase system using a vessel containing a lower aqueous phase, a middle phase and an upper hydrophobic phase having a lower density than that of the lower aqueous phase, wherein an aqueous solution of the macromolecules is added to the middle phase to form a fourth phase, followed by incubation.

15 Claims, 12 Drawing Sheets

Glass plate

PROTEIN CRYSTALLISATION METHOD

RELATED APPLICATION

This application claims priority to PCT Application No. PCT/EP2003/008369 filed Jul. 29, 2003, which claims the benefit of European Application No. 02017135.1 filed Jul. 30, 2002, Belgium Application No. 2002/0509 filed Sep. 1, 2002 and German Application No. 10301342.3 filed Jan. 16, 2003.

The invention relates to methods for the crystallization of macromolecules in a three-phase system, appropriate devices, a three-phase system, and the use thereof in automated crystallization methods.

Knowledge about the three-dimensional structure of biological macromolecules has a dramatic impact both on the development of modern biotechnology and in the therapeutic treatment of diseases. Thus, for example, the determination of the three-dimensional structure of a protein target can provide critical information for the identification and development of novel active substances which interact with the respective protein target.

The elucidation of three-dimensional structures of biological macromolecules is effected most precisely by X-ray structural analysis. A precondition for structural elucidation is that the macromolecules, such as proteins or their complexes, are available as single crystals.

Further, crystallization methods can contribute to the derivation and generation of crystalline formulations of recombinant active substances, and crystal morphology can have a significant influence on the pharmacokinetic properties of a formulation. The examination of polymorphisms of low-molecular weight compounds of synthetic or natural origin may also be realized through crystallization experiments. Another field of application of crystallization is its property as a purification method for biological macromolecules as well as of low-molecular weight compounds. Crystallization methods may be performed on both a small and a large scale.

Usually, it is tried to obtain crystals from saturated solutions of highly purified proteins in the presence of a concentrated solution of corresponding salts or polymers (polyethylene glycols etc.). The water necessary for solubility is more or less withdrawn from the protein solutions during a particular time course, so that associations of different sizes may form from fluctuations of the protein molecules. The formation of nuclei is a precondition of the formation of crystals. These processes are normally examined empirically by selecting different protein concentrations, different salts under varying ionic strength conditions, pH values, buffers, polymers, organic solvents, temperatures etc., which is a multi-parameter problem (McPherson, A., Crystallization of Biological Macromolecules, Cold Spring Harbor Press, New York, 1999).

Different crystallization methods are available. In so-called batch methods, the protein to be crystallized is added as a concentrated solution to a previously stored aqueous solution, or vice versa, in a suitable sample support (Chayen, N. E.; Stewart, P. D. S.; Maeder, D. L.; Blow, D. M.; J. Appl. Cryst., 1990, 23, 297-302; Chayen, N. E.; J. Crystal Growth, 1999, 196, 434-41). Since in this system there is no enrichment of the precipitation reagents over an extended period of time, but the final concentration is set directly when the protein solution is applied, this is called a "batch method". This method does not allow for a continuous entry into the metastable region of a phase diagram. Thus, the greatest advantage of classical crystallization methods is lost (kinetic properties and dynamic end-point determination, see FIG. 1).

A modified method of the batch method is to use a paraffin oil to which poly(dimethylsiloxane) (DMS), for example, has been added in stead of the pure paraffin oil, so that a continuous diffusion of water from the solution takes place (D'Arcy A.; Elmore, C.; Stihle, M.; Johnston, J. E.; J. Crystal. Growth. 1996, 168, 175-80). However, this method does not allow for setting an end point because the system is not a closed one. A great drawback is the fact that the protein solution will dry completely over a particular period of time. Thus, it can be used only conditionally for crystallogenesis (see FIG. 1).

In contrast, in classical methods (hanging/sitting drop), one drop of a protein solution (with added reservoir solution) is usually incubated in a closed vessel with a reservoir of an aqueous solution of a predetermined higher concentration with exclusion of air. Over time, water evaporates from the drop, so that the protein concentration increases continuously. An end point is reached when the drop is in equilibrium with the reservoir. Thus, the end point can be set through the concentration of the excess reservoir.

However, the provision of crystals suitable for structural elucidation is often associated with great difficulty or not possible at all by the known methods. It frequently happens that ordered crystallization does not occur for unknown reasons. The interplay of physico-chemical processes occurring during crystallogenesis has not been described clearly to date because crystallization has escaped a consequent analysis. When crystals are obtained, they often fail to be of sufficient size or quality.

In view of the great progress achieved in recent years in the elucidation/identification of gene and protein sequences by novel and automated methods, it is desirable to subject the numerous novel proteins which can now be expressed to systematic examination using automated methods. Also, subsections of X-ray structural analysis have experienced huge increases of efficiency in recent years. Contributions were made, inter alia, by the provision of X-ray sources of high brilliance (synchrotrons) and by the provision of efficient hardware and software for the interpretation of data. However, to date, the known methods for the crystallization of biological macromolecules could not be performed satisfactorily as automated high-throughput methods (Chayen, N. E., and Saridakis, E.; Acta Cryst. 2002, D58, 921-27). Therefore, there is a great need for methods for the crystallization of proteins which are readily automated and thus allow for the screening of the proteins having become available in the meantime and the systematic production of crystals.

In automated diffusion experiments according to the hanging drop or sitting drop methods, closed systems are sealed, for example, by siliconized glass covers or by self-adhesive transparent sheets. In the hanging drop method, a drop must be pipetted respectively to the bottom side of a cover, the cover inverted and placed onto a liquid reservoir without adversely affecting the drop, and an air-tight seal must be achieved. For a robot, this is connected with a relatively high number of tedious operations. Such automated methods are not attractive in terms of cost, speed and reproducibility and are not readily realized with ultrasmall sample volumes (see also Chayen and Saridakis, 2002).

Especially when ultrasmall sample volumes are employed, it is to be taken care that the solutions are protected from exhaustive evaporation as long as the systems are not sealed, for example, by the application of self-adhesive sheets or by covers, i.e., mechanically.

A large number of different devices for the crystallization of biological macromolecules exist. Thus, for example, the U.S. Pat. No. 5,096,676 describes a device for crystallization in a sitting drop which can be sealed, for example, by means of a self-adhesive sheet. Further devices are described in U.S. Pat. Nos. 5,130,105; 5,221,410; 5,400,741; 5,419,278; 6,039, 804, and in the applications US-2002/0141905; US-2003/ 0010278, WO-00/60345, WO-01/88231 and WO-02/ 102503.

All these devices allow for classical vapor-diffusion crystallization experiments and must be sealed mechanically, for example, by means of a self-adhesive sheet.

In automated batch methods, robots place the solutions used in the corresponding screening setups under paraffin oil, for example (Chayen, N. E., and Blow, D. M.; J. Crystal Growth, 1992, 122, 176-80). Thus, the aqueous solution is directly protected from exhaustive evaporation. This is important, in particular, when ultrasmall sample volumes are employed, because the slightest losses of water can cause the set concentrations to vary significantly and thus affect reproducibility (interference sources). Such automated methods are connected with the usual disadvantages of batch methods, because no change of concentration and, in case of a change in concentration, no end point can be set. However, the application of adaptive crystallization methods based on statistical analysis requires an exact knowledge of the final concentration.

The present invention is based on the problem of providing a crystallization method which overcomes the known drawbacks of the prior art methods. In particular, it should be made possible to obtain crystals of macromolecules as homogenous and large as possible at a relatively small expenditure and with a relatively high probability of success.

The method according to the invention should also be suitable as an automated method for the screening of crystallization setups. In particular, the automated method according to the invention should be readily performed by robots with relatively few operations and overcome the described drawbacks of automated crystallization methods.

The object of the invention is surprisingly achieved by a method for the crystallization of macromolecules in a three-phase system using a vessel containing a lower aqueous phase, a middle phase and an upper hydrophobic phase having a lower density than that of the lower aqueous phase, wherein an aqueous solution of the macromolecules is added to the middle phase to form a fourth phase, followed by incubation.

The invention is based on the provision and use of a three-phase system. The aqueous solution of the macromolecules forms a fourth phase which does not immediately mix with the lower phase. Generally, the fourth phase is added in such an amount as to form a drop. Preferably, the fourth phase will migrate to the phase boundary between the lower and middle phases after having been introduced into the vessel. Mixing with the lower phase, which is also an aqueous phase, does not occur. Rather, the fourth phase remains in the system at least until the crystallization process begins. In alternative embodiments, the fourth phase becomes positioned at the phase boundary between the middle and upper phases or within the middle phase. What is important is that no immediate mixing with the lower aqueous phase takes place. The term "fourth phase" generally designates the aqueous solution of the macromolecule, even if the three-phase system consisting of the lower, upper and middle phases has not yet formed completely.

DETAILED DESCRIPTION OF THE INVENTION

Figure 1:
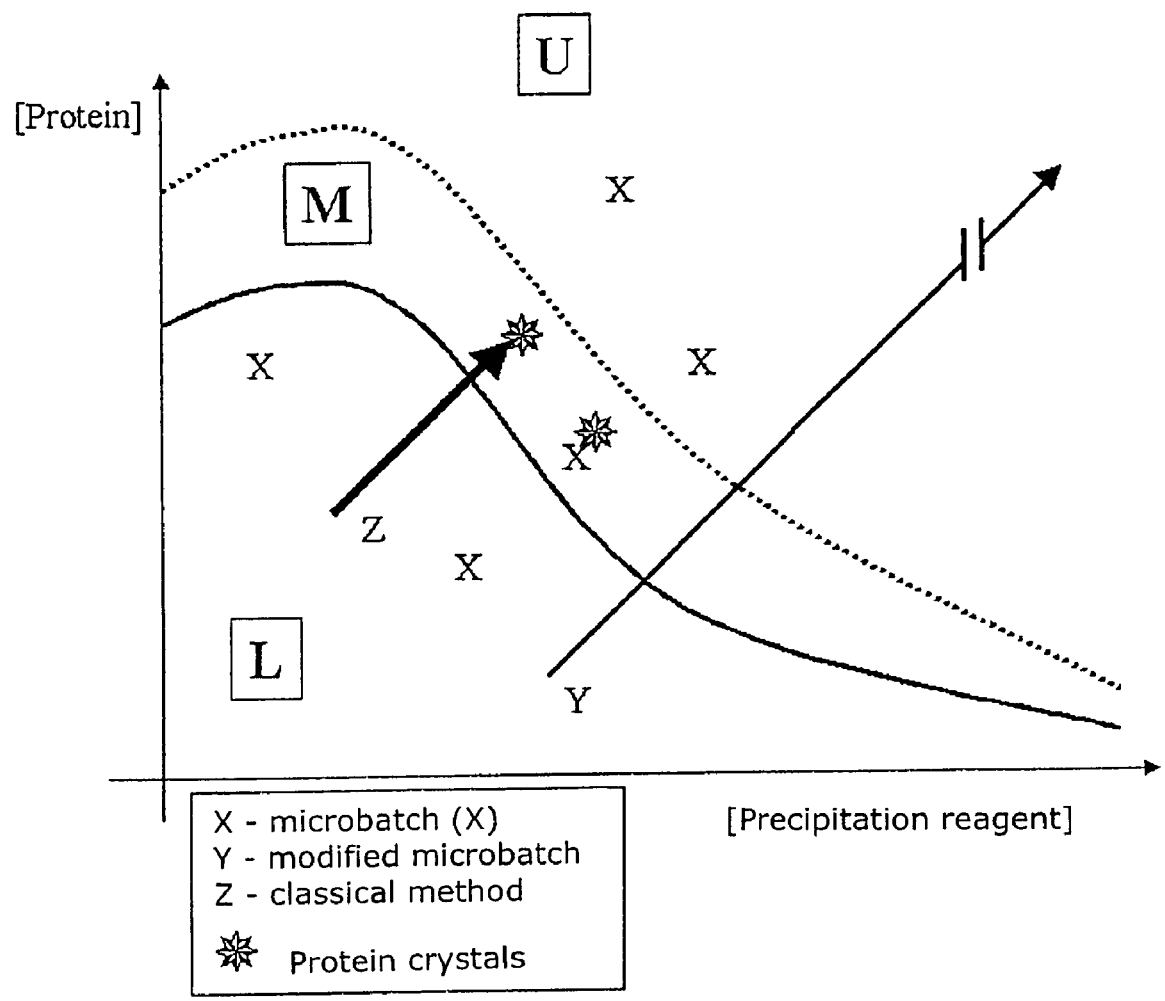
FIG. 1 describes physico-chemical relationships in a phase diagram.

FIG. 1 shows simply and schematically the different behaviors of the usual crystallization methods in a phase diagram. L, M and U respectively designate the soluble, metastable and unstable regions of the phase diagram.

Figure 2:
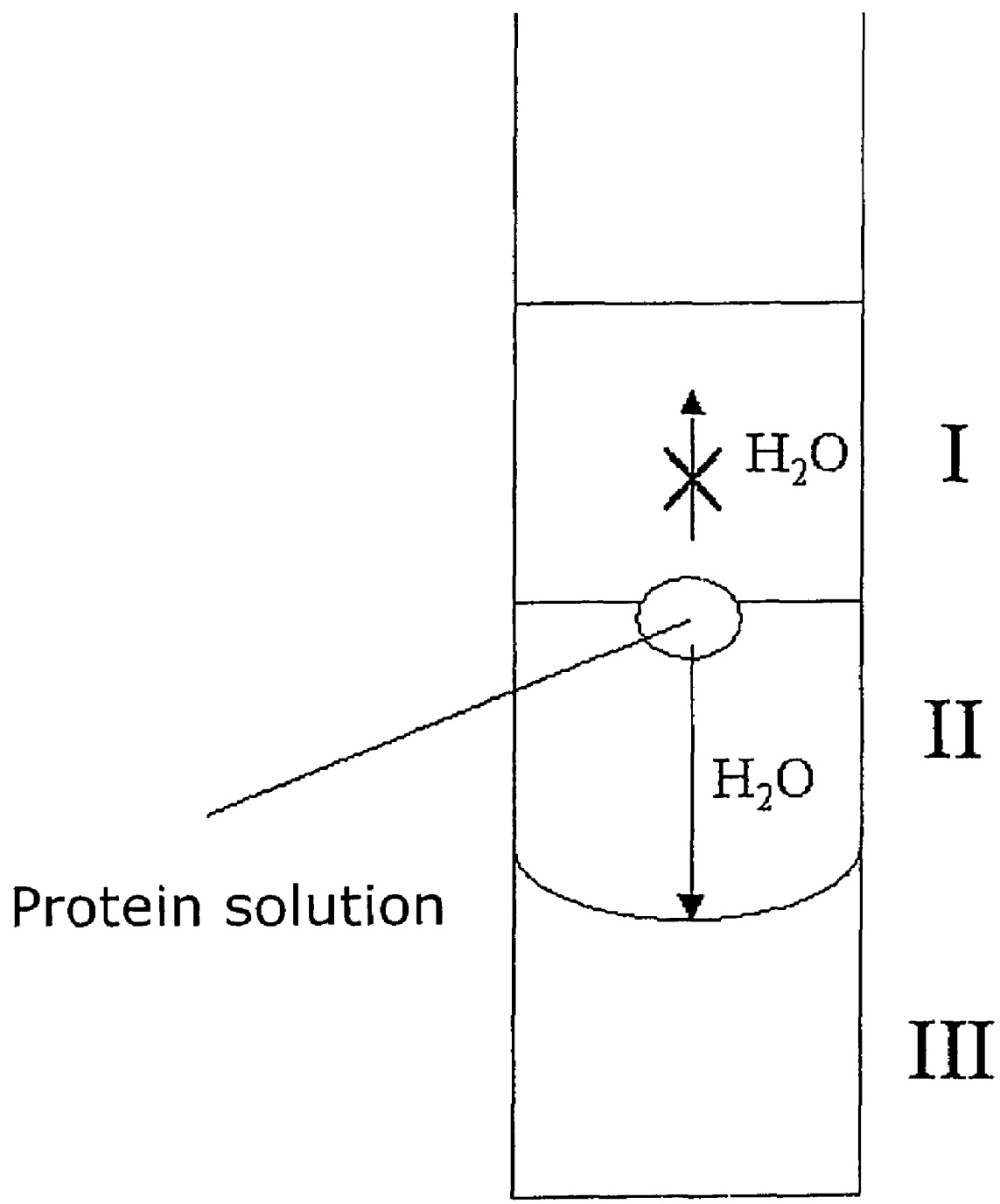
FIG. 2 describes the schematic structure of a three-phase system.

FIG. 2 shows the schematic structure of a three-phase system according to the invention with a fourth phase in the form of a drop localized at the phase boundary between the upper and middle phases. According to the invention, upward diffusion of water essentially does not occur. I, II and III correspond to the upper, middle and lower phases, respectively.

Figure 3:
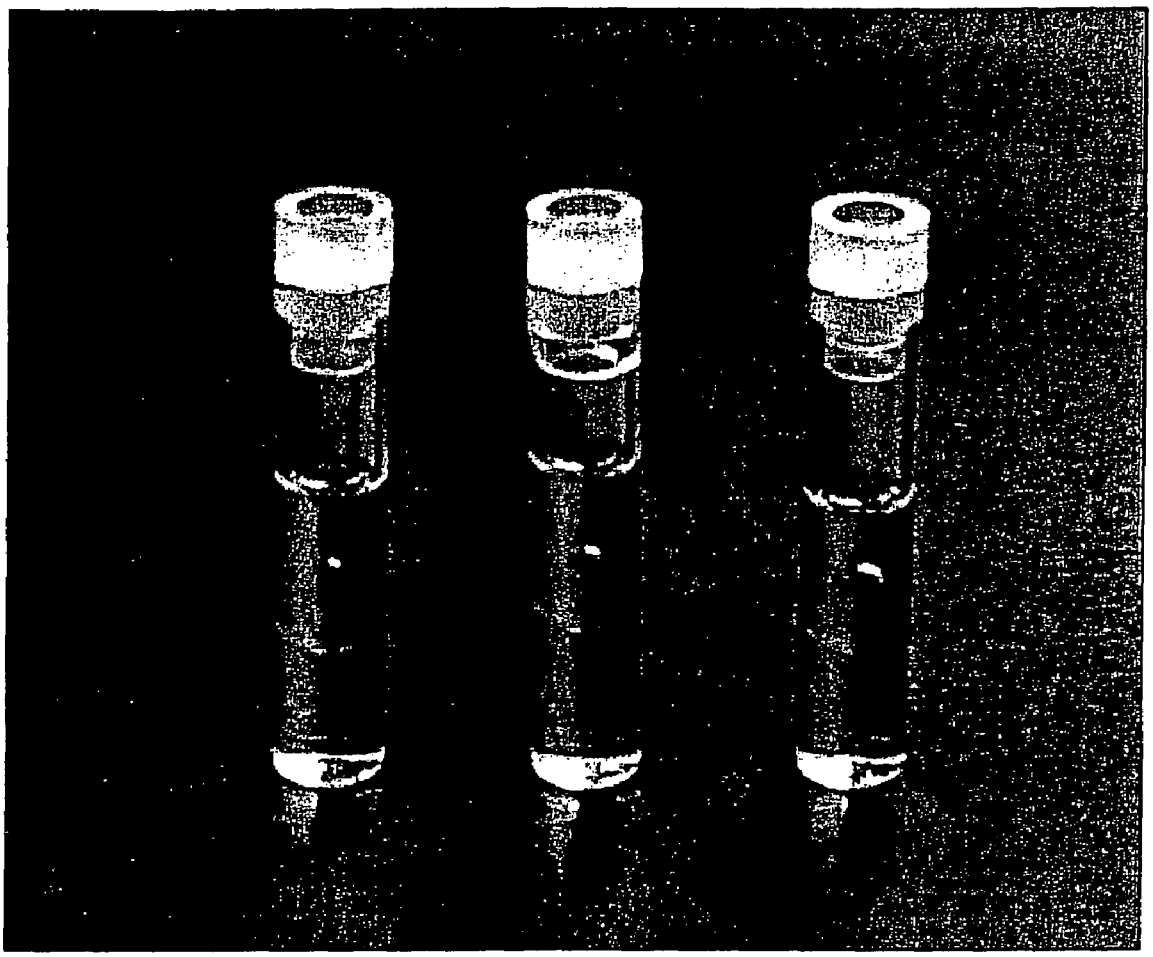
FIG. 3 shows a photography for three three-phase systems.

FIG. 3 shows a photograph of three three-phase systems according to the invention in which the solution of the macromolecule is respectively localized in the form of a drop between the upper and middle phases.

Figure 4:
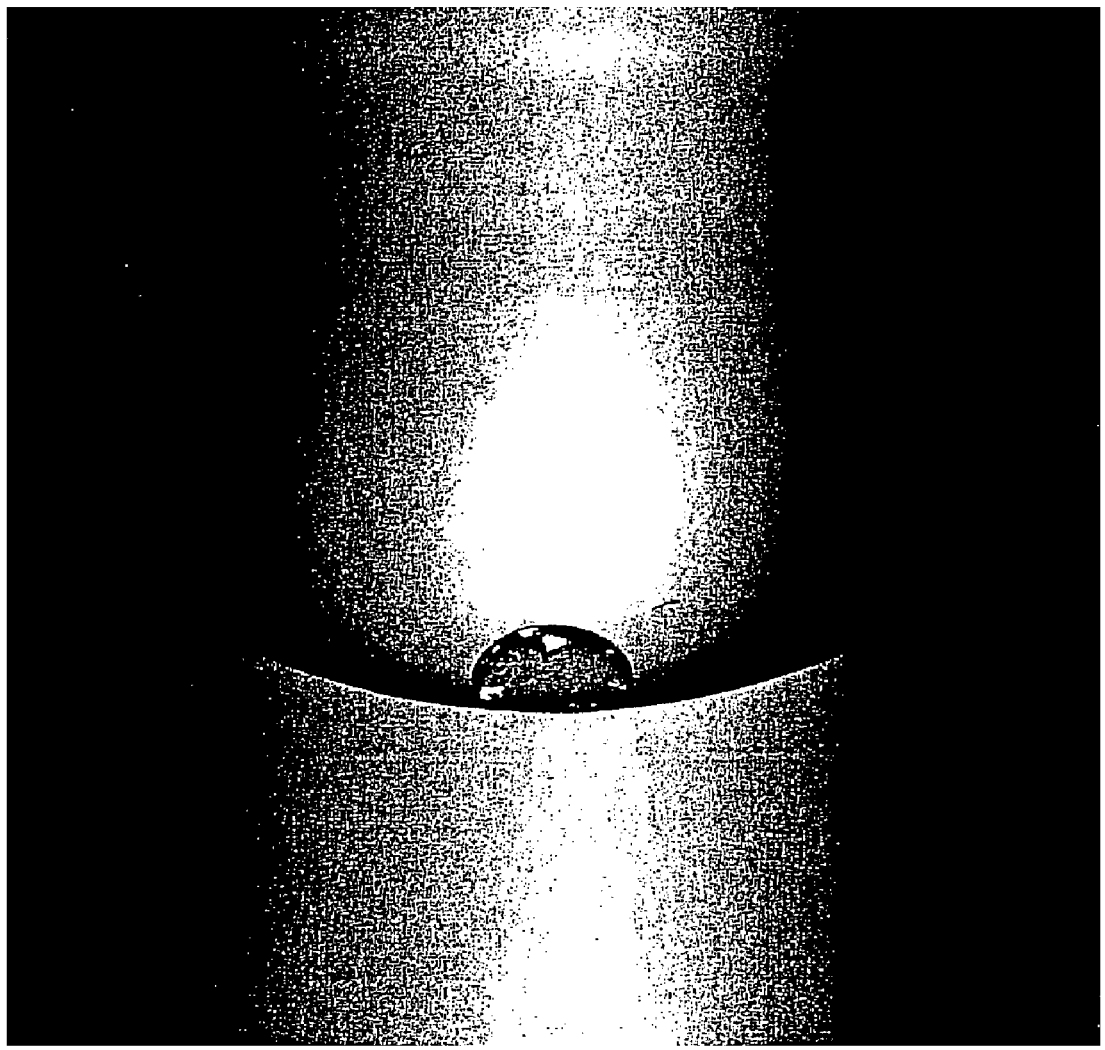
FIG. 4 shows an enlarged view of a solution of a macromolecule.

FIG. 4 shows a close-up view of a solution of the macromolecule positioned at the phase boundary between the middle and lower phases.

Figure 5:
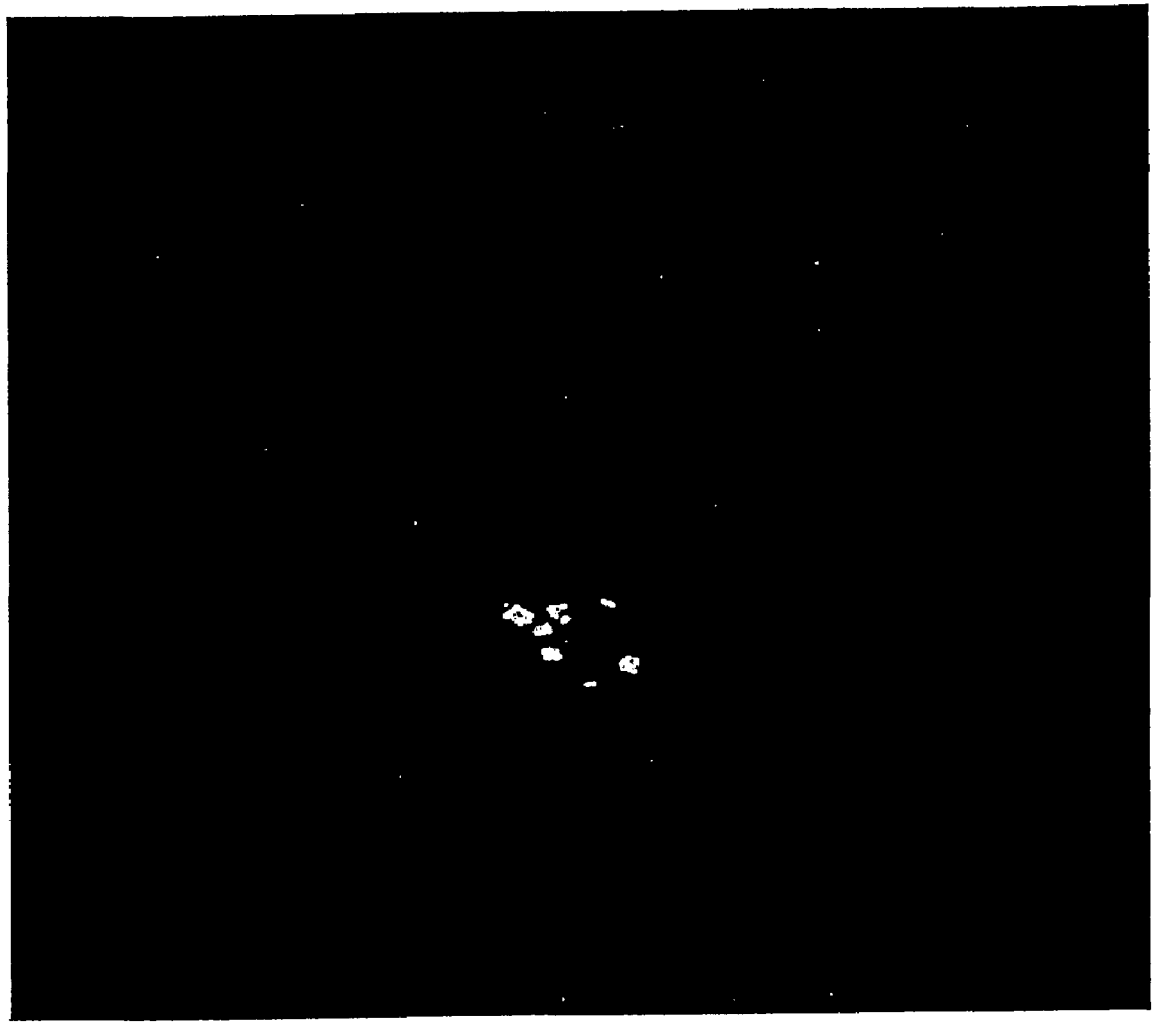
FIG. 5 shows a close-up view of crystals obtained from the arrangement in FIG. 4.

FIG. 5 shows a close-up view of the crystals formed in a three-phase system according to the invention for the same setup as in FIG. 4. The lysozyme crystals can be detected with polarized light and an analyzer shifted by 90°.

The phases of the crystallization system are illustrated schematically by FIG. 2 and photographically by FIG. 3. In FIG. 3, a fourth phase in the form of a drop is positioned at the phase boundary between the middle and upper phases. The phase boundary cannot be seen clearly in FIG. 3, but FIG. 4 shows a close-up view of a fourth phase at the phase boundary between the middle and lower phases. In this metastable state, the fourth phase remains over an extended period of time and does not intrude into the lower aqueous phase.

The fourth phase will not mix completely with the lower phase until the crystallization begins in the fourth phase or at a phase boundary with the fourth phase. Preferably, the fourth phase is distinguishable for at least 6, 12 or 24 hours, more preferably for at least 2, 4, 6, 14, 21 or 30 days.

Figure 6:
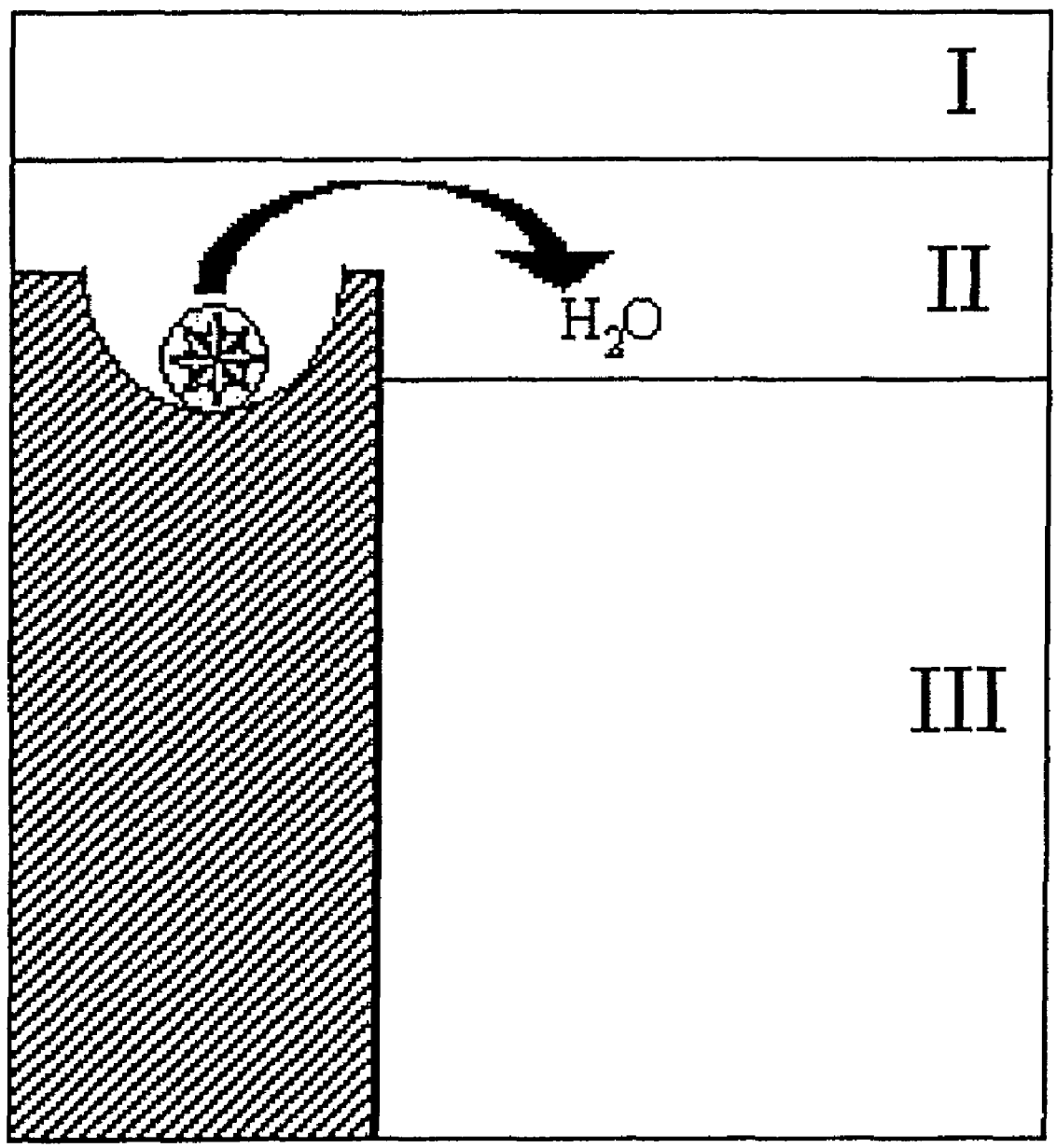
FIG. 6 shows a special embodiment.

In a preferred embodiment, the vessel employed is designed in such a way that the fourth phase cannot come into contact with the lower phase. The fourth phase is stabilized mechanically then. In this case, the fourth phase is preferably localized in a subsection which is separated from the remaining sample vessel by lateral walls. Thus, the fourth phase is localized in an indentation or compartment. FIG. 6 schematically shows how such an embodiment can be realized according to the invention. In this embodiment, the solution of the macromolecule is prevented by an indentation within the vessel from moving further towards the lower phase. The diffusion of $H_2O$ is in the direction of the arrow. I, II and III correspond to the upper, middle and lower phases, respectively.

Figure 7:
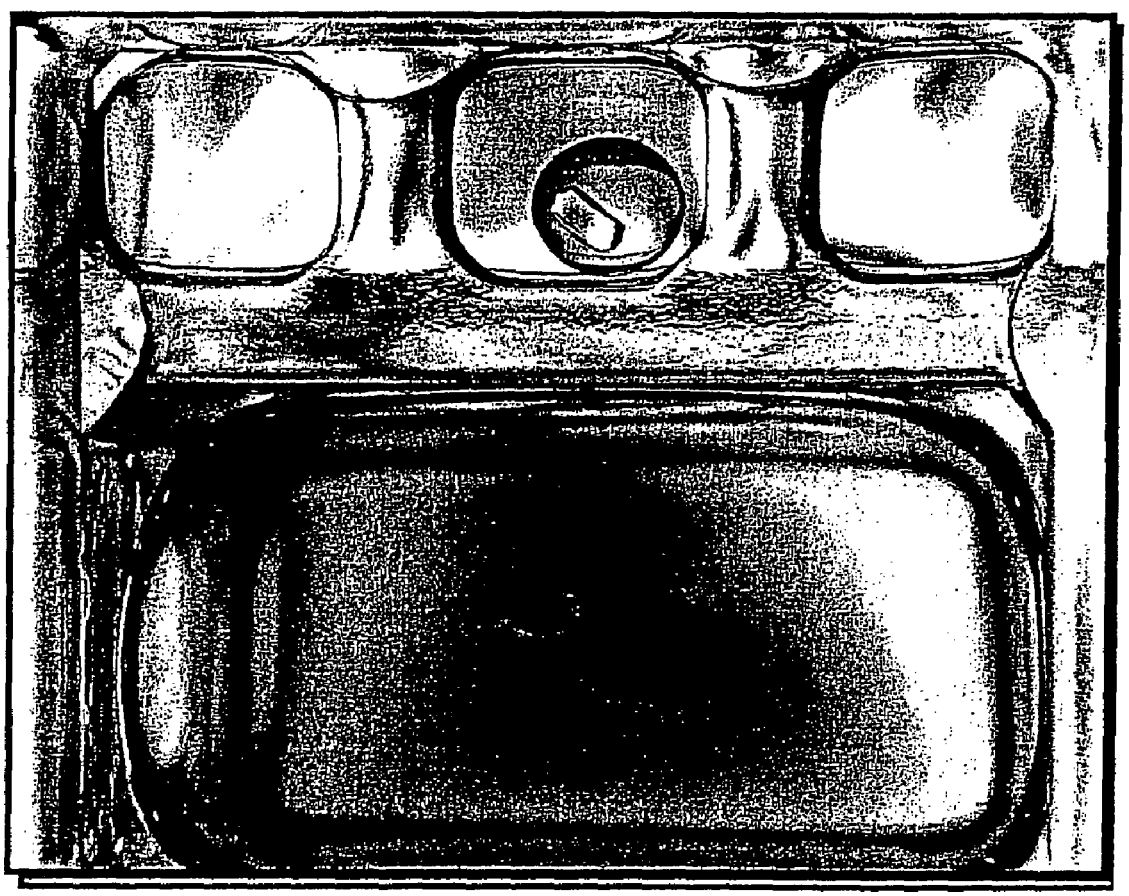
FIG. 7 shows a photograph of the system according to the invention in which three indentations are arranged on one reservoir.

Due to a physical barrier, the drop cannot reach the lower phase. According to the invention, it is possible to induce more than one solution of macromolecules to crystallize as separated phases in a three-phase system. FIG. 7 shows an embodiment of the vessel according to the invention with three recesses. A photograph with a top view onto a system according to the invention is shown in which three indentations are arranged commonly at one reservoir. In the middle indentation, clearly visible crystals have formed. The indentations are connected with the reservoir through a continuous middle phase through which $H_2O$ can diffuse to the reservoir. In the middle recess, there is a fourth phase remotely separated from the lower phase. According to the invention, such embodiments can also be realized as multiwell plates which allow for the simultaneous or sequential examination of a large number of samples.

In a further embodiment, the lower aqueous phase may also be replaced/complemented with a phase having hygroscopic properties of withdrawing water with respect to the solution of the macromolecule. The hygroscopic substance may be solid and/or liquid in nature. In contrast to batch methods, the withdrawal of water causes a change of concentration in the system which involves an endpoint, which also depends on the selection of the nature and quantity of the hygroscopic substance.

In a preferred embodiment, a three-phase system is established before the fourth phase is added. In a further embodiment, the fourth phase is charged first in the subsections which are separated from the remaining sample vessel, followed by establishing the three-phase system. In a screening test, the protein solution of the aqueous fourth phase is then added to one subsection and can again reach equilibrium with the lower phase by the withdrawal of $H_2O$. In a further embodiment, the upper phase may be applied beyond the edges of the sample vessels, whereupon the lower phase is applied to each sample vessel. Thus, the system is protected from evaporation from the beginning. Then, a drop can be taken up from the lower phase and applied to the separated subsections. The protein solution can then be applied to the drop in the separated subsection, followed by the second phase which is added to each sample vessel, but without going above the edge of the individual sample vessels.

In a preferred embodiment, the indentations or compartments and/or their lateral wall or walls are on different levels, so that only one or else several indentations or compartments, depending on the quantity applied of the second phase, can equilibrate with the lower phase, the reservoir solution, through the second phase. The indentations or compartments which communicate with the lower phase behave like classical vapor-diffusion methods. The indentations which do not equilibrate with the reservoir solution behave like classical microbatch methods because they are surrounded by paraffin oil, for example. Thus, it is possible to realize both a classical setup and a microbatch setup in one operation in one sample position of a sample support.

From the approaches shown here, it can be seen that the setup of the crystallization experiments can be realized in a wide variety of variants.

Through the upper phase, there is essentially no diffusion of $H_2O$ from the vessel over the duration of the crystallization process. In a preferred embodiment, the upper phase contains paraffin oil. However, any other oil or any other liquid which is capable of limiting the evaporation of water from the system as an upper phase may also be used. In a further embodiment, the upper phase is a sheet or cover which is capable of limiting the evaporation of water from the system.

The middle phase is selected to have a diffusion of $H_2O$ from the fourth phase into the lower phase. Therefore, the concentration of the macromolecule in the fourth phase increases continuously. Since the overall system essentially does not lose any water, an end point for crystallization at which the lower and fourth phases are in equilibrium can be set by selecting the composition of the aqueous lower phase.

The middle phase may also consist of complex mixtures, e.g., of different viscosities and/or chemical natures. Further, the middle phase may not reduce the diffusion-inhibiting properties of the upper phase disproportionately.

In preferred embodiments, the middle phase contains hydroxy-terminated poly(di-methylsiloxane) and/or phenylmethyl polysiloxanes, especially phenylmethyl dimethyl polysiloxanes. In selecting the liquid for the middle phase, its viscosity, in particular, and, in the case of phenylmethylsilicone oil, the ratio of methyl to phenyl groups are important.

The lower aqueous phase preferably contains salts, buffer substances, polymers and/or organic solvents.

In preferred embodiments, the aqueous solution of the macromolecule contains salts, buffer substances, polymers and/or organic solvents.

In a preferred embodiment, the aqueous solution of the macromolecule contains the same components as the lower aqueous phase, except for the macromolecule and at lower concentrations.

In a preferred embodiment, the aqueous solution of the macromolecule is prepared by combining a certain volume of the lower phase with a certain volume of the aqueous solution of the macromolecule.

In a preferred embodiment, the fourth phase has a volume of between 1 pl and 10 µl, preferably from 100 pl to 2 µl, more preferably from 10 to 500 nl.

In preferred embodiments, the macromolecules of the fourth phase which are crystallized according to the invention are proteins, DNA, RNA, complexes of macromolecules, protein complexes, protein/ligand complexes, DNA/ligand complexes, protein/RNA complexes, protein/DNA complexes, viruses or viral fragments. In general, macromolecules as well as other large molecules of biological or synthetic origin can be crystallized according to the invention.

The invention also relates to crystals of macromolecules which have been prepared by the method according to the invention. The method of the invention is also a preparation method for crystals of macromolecules.

The invention also relates to structures of macromolecules established by the examination of crystals produced by the method according to the invention.

The invention also relates to a three-phase system for the crystallization of macromolecules in which three phases are on top of one another in one vessel, wherein these phases are a lower aqueous phase, a middle phase and an upper hydrophobic phase having a lower density than that of the lower aqueous phase. Vessels in which the phases are juxtaposed, for example, in microfluidic systems, may also be conceived. The three phases are preferably liquid. However, different embodiments may also be performed according to the invention. Thus, the lower phase may be gel-like or solid, for example. The three-phase system according to the invention (with or without a fourth phase) can be established in a wide variety of ways. Thus, for example, the lower aqueous phase may be charged first or inserted later under the other layers. It is only essential to the invention that an essentially stable system for crystallization is obtained in which the phases are separated from each other as neatly as possible.

The method according to the invention enables relatively uniform and large crystals to be obtained. The method is simple, fast to perform and highly reproducible, the problem of evaporation being avoided even if low quantities of proteins are used. Depending on the embodiment, there are no or little wall contacts with the sample support, which results in a lower nucleation rate and thus in larger crystals. The protein drops have a homogeneous shape and exhibit less disturbing effects as compared with classical methods, which simplified methods of image recording and image evaluation. Due to the presence of the second phase, the skin which often forms in classical methods and which surrounds the drop is avoided, which enables an easier handling and isolation of the crystals. The selection of the middle phase provides an additional parameter with respect to the dynamics of the setting of the end point, which co-determines the nucleation rate.

Depending on the embodiment, the system may be taken out of the supersaturated state after a nucleation event has been observed, by adding a particular amount of water, for example, to the lower phase as a reservoir solution. This may prevent, in particular, the formation of further nuclei and thus result in larger protein crystals. After the crystal growth of the initial crystallization nucleus or nuclei has slowed down by achieving the equilibrium state, the crystal growth can be gradually reinitiated and further promoted by adding a concentrate of the precipitation reagent or a hygroscopic substance into the reservoir solution without initiating renewed nucleation. This results in single crystals of substantial size. In contrast to previously described methods (Chayen, N. E.; J. Crystal Growth, 1999, 196, 434-41), the tedious opening of sealed systems is no longer necessary due to the liquid nature of the phases. Further, in one embodiment, the crystal growth described herein may be realized with employing continuous monitoring, which serves for the detection of nuclei in addition to the characterization of the solution parameters, such as the determination of the second virial coefficient. In addition to the classical image analysis methods, especially methods of dynamic light scattering are suitable for the detection of nucleation events, because they can detect nuclei very early (Rosenberger, F.; Vekilov, P. G.; Muschol, M.; Thomas, B. R.; Journal of Crystal Growth, 1996, 168, 1-27; Saridakis, E.; Dierks, K.; Moreno, A.; Dieckmann, M. W.; Chayen, N. E.; Acta Crystallographica, 2002, D58, 1597-1600; Spraggon, G.; Lesley, S. A.; Kreusch, A.; Priestle, J. P.; Acta Crystallographica, 2002, D58, 1915-1923).

Further, the diffusion process may also be stopped by pipetting off the middle phase by withdrawing a sufficient amount of the middle phase and disrupting the liquid communication between the drop which forms the fourth phase and the lower phase in the reservoir. In a preferred embodiment, initial solution parameters may be determined, followed by initiating the diffusion process by adding the middle phase under the upper phase.

Especially the determination of initial solution parameters, such as the second virial coefficient, must be realized in such a way that no concentration change affects the solution parameters. The second virial coefficient enables conclusions to be drawn on the intermolecular interactions between macromolecules, which is the basis of the non-ideality of a solution with respect to its osmotic pressure. A positive virial coefficient indicates repulsive interactions while a negative virial coefficient indicates attractive interactions. It is known that a slightly negative virial coefficient often promotes crystallization, but that a highly negative value results in a less ordered precipitation (George, A.; Wilson, W. W.; Acta Crystallographica, 1994, D50, 361-365; George, A.; Chiang, Y.; Guo, B.; Arabshahi, A.; Cai, Z., Wilson, W. W.; Methods in Enzymology, 1997, 276, 100-110). Since, for determining the second virial coefficient, a static laser light scattering measurement is realized over a concentration series of the macromolecule at defined solution parameters, such as a constant salt concentration and constant pH, it is important that the solution parameters remain constant between several measurements and unaffected by the diffusion of water molecules to the reservoir solution. This is possible in the initial batch mode of the novel method according to which the diffusion process is initiated only after the completion of all measurements within a sample array by adding the second phase.

In particular, the invention also relates to the use of the method, the device and/or the three-phase system according to the invention for automated crystallization or for automated screening. The method according to the invention is highly suitable for use within the scope of automated robot-assisted methods. In comparison with the classical methods, significantly less operations are required. The robot must merely pipette the solutions successively. In a preferred embodiment, the solutions are prepipetted, and the solution of the macromolecule need only be added. The application of glass covers, the turning of the covers or the sealing of the system with a plastic sheet or the like are no longer required. Nevertheless, the crystallization involves a dynamically settable end point.

The invention also relates to a device for the crystallization of macromolecules in which a plurality of sample vessels are arranged to form a sample support, said sample support having a continuous edge which extends higher than the openings of the sample vessels. Within the sample vessels, there is the lower aqueous phase covered by a layer of the middle phase. Since the sample support has an elevated edge, all the sample vessels can be simultaneously covered by a layer of the upper phase in one operation. The upper phase seals each sample vessel upwards and forms a single contiguous phase above which goes through the whole sample support. In this way, it is no longer required to apply the upper phase to each individual sample vessel. In one embodiment, two or more sample vessels may communicate through the second phase, for example, by realizing a notch in the lateral boundary of two or more sample vessels. If the lower phase is applied to only one sample vessel in this embodiment and the lower phase in the other sample vessels is replaced, for example, by the middle phase, then the dynamics of the end point determination and thus the nucleation rate can be influenced by the lower phase depending on the distance to the sample vessel. This enables a screening of the influence of the dynamics of the end point determination on the quality of the protein single crystals.

In a preferred embodiment, a subsection (indentation) which is separated by lateral walls from the remaining part of the sample vessel exists in each sample vessel, wherein the lateral walls are lower than the lateral walls of the sample vessel. Such embodiments are represented in FIGS. 11 to 14.

Figure 11:
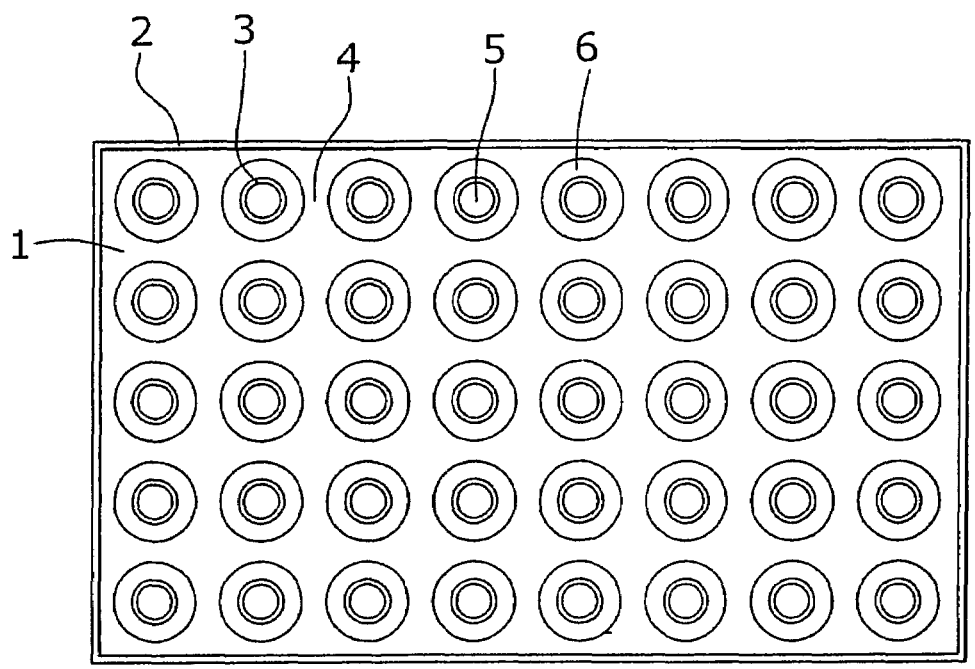
FIG. 11 shows an embodiment of the sample support according to the invention.

FIG. 11 shows a sample support (1) according to the invention with sample vessels (6), lateral walls of the sample vessels (4) and an elevated edge (2). In the sample vessels (6), subsections (5) exist which are separated from the remaining part of the sample vessel by lateral walls (3).

Such a sample support can be easily realized by first realizing a body of a sample support, for example, by known injection-molding methods, which body contains all parts of the sample support except for the glass plate. The low internal indentations within each sample support should be held by small lands which are designed to enable filling of the outer compartment by a single application of the upper phase. How the dimensional stability of the sample support is maintained when formed in the production process is known to the skilled person. The finished sample support is then obtained by bonding the glass plate adhesively to the bottom of the body. To suppress hydrophilic interaction with the fourth phase, the glass plate may be modified by known methods of surface treatment, such as siliconization or silanization.

Figure 12:
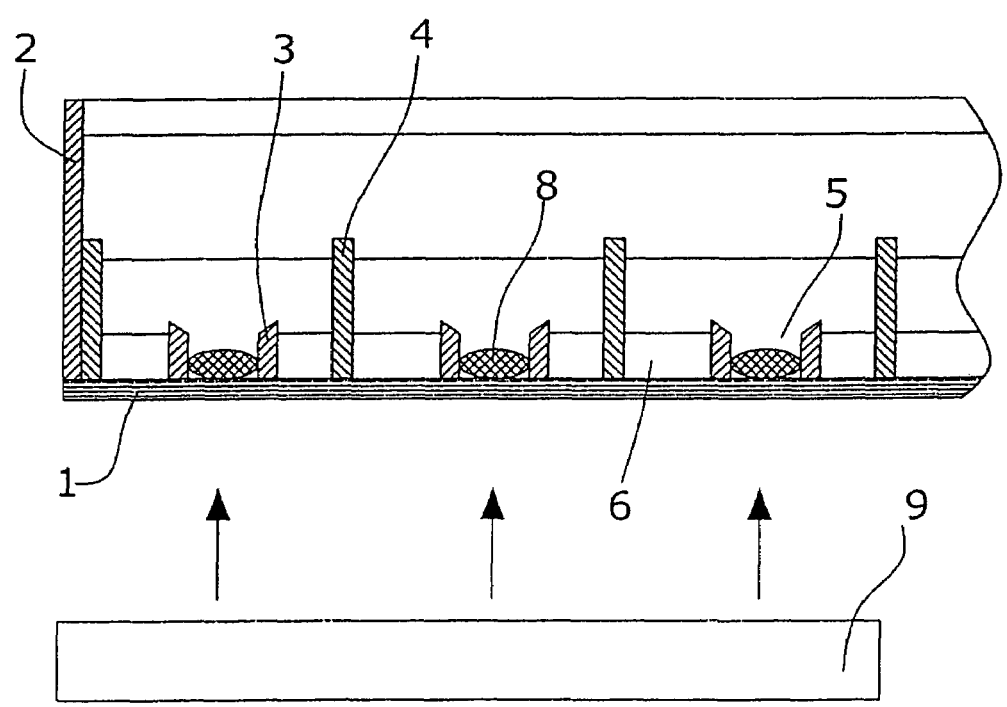
FIG. 12 schematically shows a lateral view of a vertical section through the sample support according to FIG. 11.

FIG. 12 schematically shows a lateral view of a vertical section through a sample support according to FIG. 11. Features 1 to 6 are realized as in FIG. 11. The aqueous phase of the macromolecule (fourth phase, 8) is added to the separated subsections (5) of the sample vessels (6). The development of crystals is monitored with a device (9), for example, a microscope which is provided below the sample support. In deviation from the schematic representation, the fourth phase usually has the spherical form of a drop (rather than ellipsoid) and does not touch the vessels walls laterally.

Figure 13:
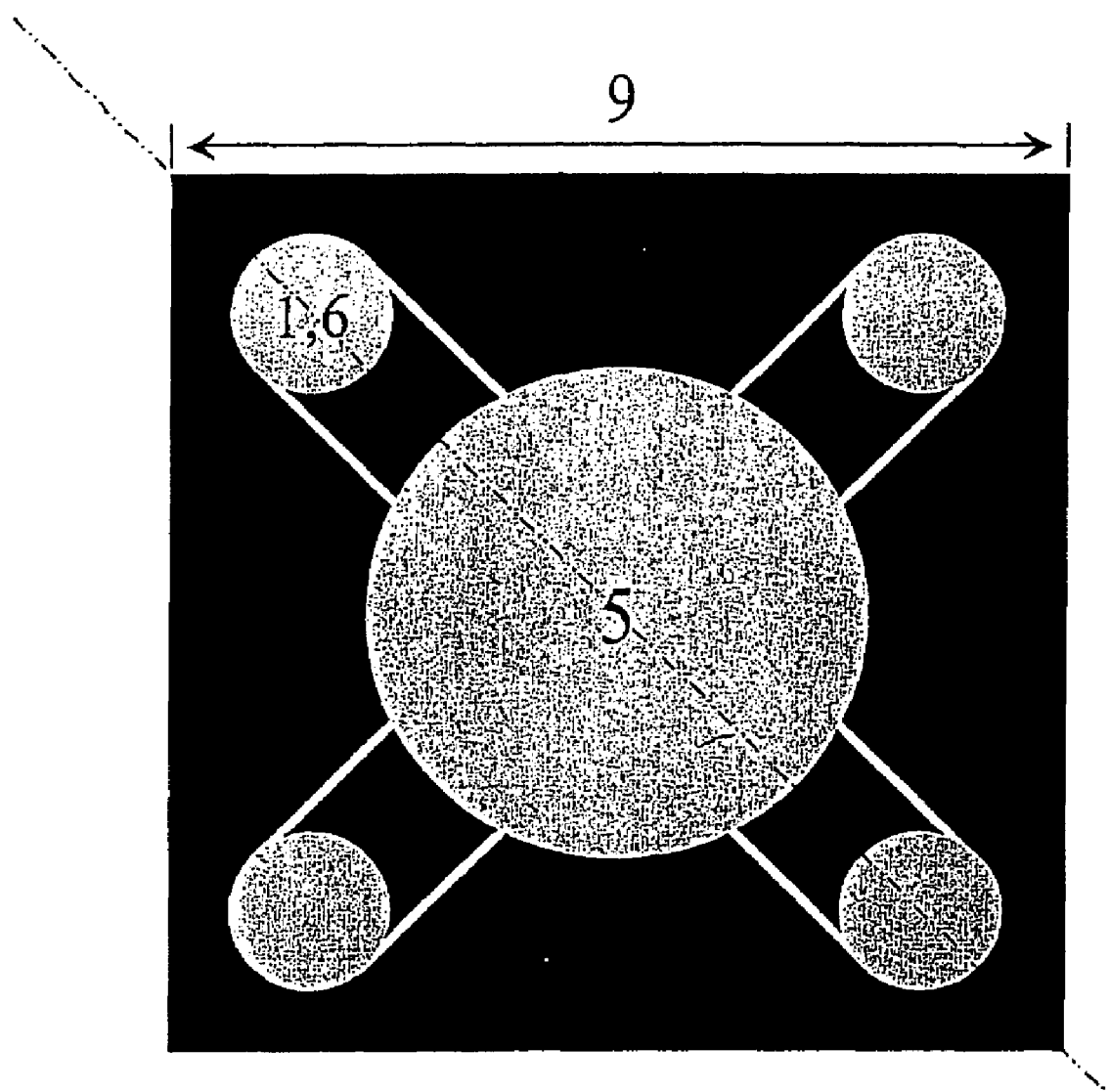
FIG. 13 shows a sample position within the sample support according to the invention.

FIG. 13 shows a sample position of a sample support according to the invention. Depending on the sample position, up to four crystallization experiments can be realized. In the center of the sample position, there is a compartment for a reservoir solution. Due to the central position and size of the reservoir, it can be easily used for mixing the complex precipitation reagents. The four compartments for the fourth phases communicate with the reservoir zone through an indentation in the body of the sample support. The bottom of the sample support is made of plastic or glass. In the case of plastic, the body of the sample support can be realized by bores. The connection between the central position for the precipitation reagent and the compartments can be realized by milling a land between the positions. The dimensions are stated in millimeters and only serve as exemplary values.

Figure 14:
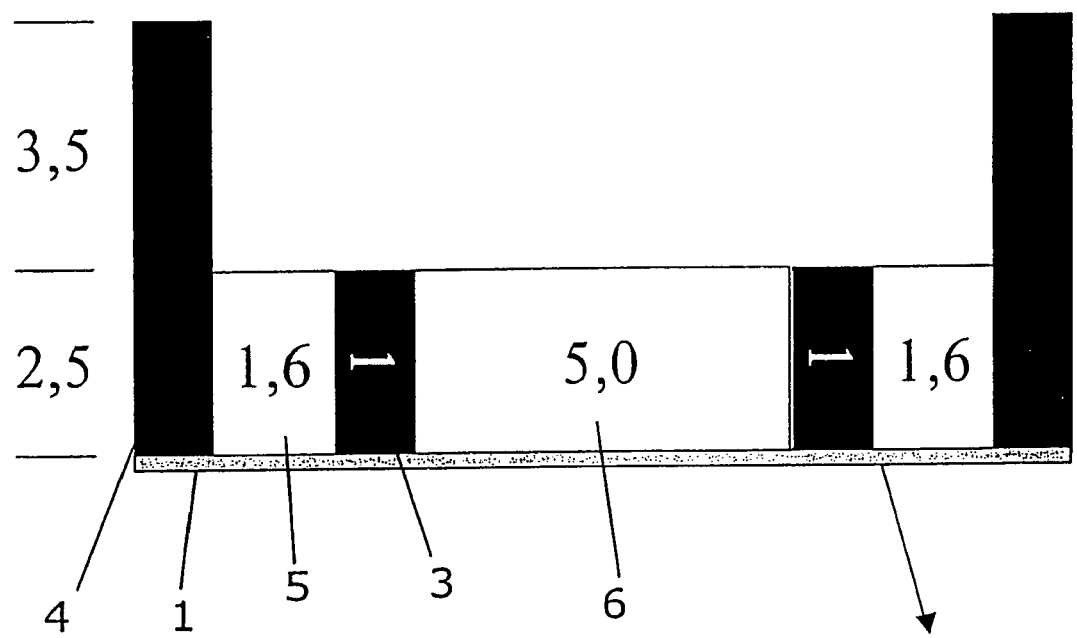
FIG. 14 schematically shows a lateral view of a diagonal section through the sample support according to FIG. 13.

FIG. 14 schematically shows a lateral view of a diagonal section through a sample position of the inventive sample support according to FIG. 13.

In FIGS. 11 and 12, the lateral walls of the subsections form a ring so that the subsections form a circle in the middle of the sample vessels. To the external part of the sample vessels, the lower phase is added to a level which is below the level of the lateral walls of the subsection, followed by a drop into the subsection or subsections. The aqueous solution of the macromolecule (the fourth phase) is added to the subsections before or after the three-phase system has been established. The middle phase is applied in such a way that the subsections are filled with the middle phase and the annular lateral wall of the subsections is covered by a layer of the middle phase. Thus, water molecules can diffuse from the fourth phase through the middle phase into the lower phase of the three-phase system.

In a preferred embodiment, the upper edges of the lateral walls of the subsections are provided with a bevel sloping inward so that the fourth phase, when applied, is directed into the subsection.

In a further embodiment, the lateral walls of the indentations or compartments are distinguished by different heights.

In a further embodiment (FIGS. 13 and 14), the subsections for the protein solution are provided around a central reservoir for the lower phase. Especially in a first operation, this design enables a simplified mixing of the liquid for the lower phase. The three-phase system is then established as has been described.

Figure 10:
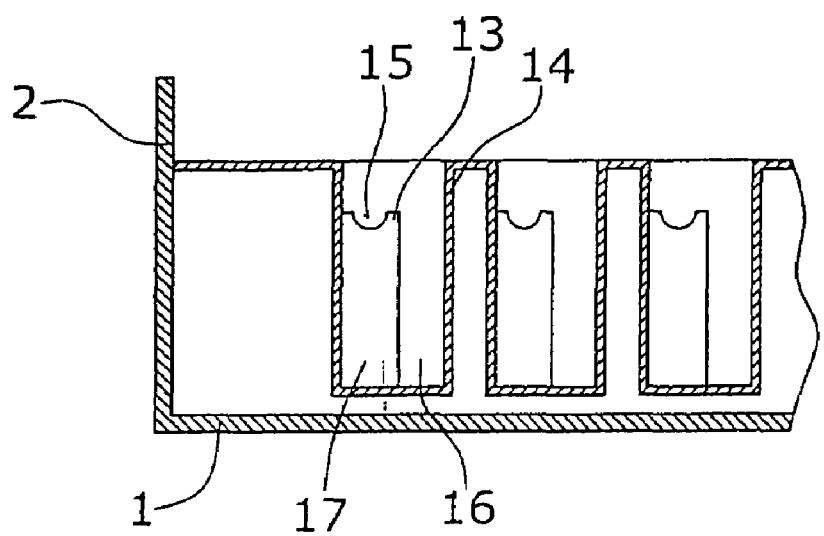
FIG. 10 shows a vertical section through the sample support according to the invention.

In a further embodiment, the bottom (1) of the subsections (5) is at the same level as the bottom of the sample vessels (6). In a further embodiment, the subsection is elevated with respect to the bottom of the sample vessel. The elevated region is below the opening of the sample vessel. In a further preferred embodiment, the sample vessels respectively have at least one elevated indentation. These embodiments of the invention are illustrated by FIG. 10. It shows a part of a vertical section through a sample support (1) according to the invention with sample vessels (16). In the embodiment shown, indentations (15) elevated over the bottom of the vessel into which or through which the solution of the macromolecule is applied exist in the individual sample vessels (16), of which three are shown in a row. The sample support is characterized by an elevated edge (2) which enables the individual sample vessels to be filled with the middle phase, and the middle phases to be covered by a contiguous layer of the upper phase. This significantly simplifies the process of providing a three-phase system according to the invention. The indentation (15) is a separated subsection (15) which is separated from the remaining sample vessel by the lateral walls (13). The top portions of the lateral walls (13) of the subsection are lower than the lateral walls (14) of the sample vessels. The indentation is positioned on a base (17). The dimensions and relations are represented schematically. For an especially employed robot system, a sample support with suitable dimensions will be selected.

In a further embodiment, the subsection is elevated over the bottom of the sample vessel, and the remaining part of the sample vessel, but not the subsection, is partially or completely open at the bottom, so that all the lower phases are interconnected. In this case, only single applications of the lower phase, the middle phase and the upper phase must be effected. This embodiment is employed if different solutions of the macromolecule are to be examined with respect to a single defined lower phase. This embodiment can be realized also if, in a sample support with elevated edge according to the invention, sample vessels are positioned at a defined level below the elevated edge, so that they are only connected with each other if required by the stability of the sample support, for example, through a grid. In such sample supports, a drop of the respective aqueous solution (fourth phase) to be tested is then applied in addition to a drop of the lower phase.

Preferably, the bottom of the sample support is optically homogeneous. A glass bottom is preferred.

Thus, in addition to microphotographs, further optical measuring methods can be recurred to for the characterization of the solution parameters and/or the biological macromolecules, such as various light scattering methods (e.g., elastic, quasielastic and/or inelastic light scattering) for determining concentrations, sizes, size distributions, but also thermodynamic parameters, such as the second virial coefficient and/or hydrodynamic parameters. Further, spectroscopic methods, such as fluorescence anisotropy/fluorescence depolarization, using intrinsic or extrinsic fluorophors and/or further polarization-spectroscopic methods (Winter, R., and Noll, F.; Methoden der biophysikalischen Chemie, Teubner Studienbücher Chemie, Teubner Verlag, ISBN: 3-519-03518-9) are available. For this purpose, drops realized in the method presented herein have the positive property of possessing, for a volume of 1 µl, approximately the same top-view diameter as drops of 200 nl in classical sitting drop experiments. Thus, due to their spheroid topography, the drops of the method presented herein exhibit better conditions for the application of the above mentioned methods, especially using confocal measuring geometries. Further, the glass bottom and the optically homogeneous middle and upper phases exhibit better conditions for the application of the above mentioned methods as compared to systems sealed by plastic sheets. The use of an optically homogeneous cover can be dispensed with. Further, the refractive index of many liquids of the middle phase employed herein is within a range of between 1.4 and 1.5, which is a further advantage in the application of the above mentioned methods.

Further, the photographic images obtained and other parameters can be filed in a data base to enable subsequent analysis of the crystallization experiments on a computer and/or to apply known image-analysis methods, such as differential image analysis and/or edge detection. Known methods for the evaluation of precipitate morphologies as well as adapted NMR and ultrasonic based methods may also be employed. Then, the evaluation of the different parameters of the crystallization experiments realized allow for the systematic derivation of new improved crystallization conditions after statistic evaluation. Further, photographic images and other parameters can be filed in a data base by means of a microscope to subsequently enable analysis of the crystallization experiments on a computer and/or apply known image analysis methods, such as differential image analysis and/or edge detection.

The invention also relates to a device (1) for the crystallization of macromolecules in which a multitude of sample vessels (6) are arranged to form a sample support in which at least one subsection (5) separated from the remaining sample vessel by lateral walls (3) exists in each sample vessel (6), wherein the top portions of the lateral walls (3) are lower than the walls of the sample vessel (4), characterized in that the bottom of the sample support is optically homogeneous and that the bottom (1) of the subsections (5) is at the same level as the bottom of the sample vessels (6). Due to the topography of the sample support, an elevated edge surrounding the device can be dispensed with in this embodiment. The sample support can be prepared in a simple manner and is also suitable for performing classical crystallization experiments and is a less expensive variant with an optically homogeneous bottom as compared to existing sample supports. Over the classical high-throughput sample supports used for vapor-diffusion experiments, the optically homogeneous bottom has the advantage that the detection of the crystals highly facilitates detection of crystals having non-cubic symmetry using polarized light due to the absence of birefringence effects of the polymers.

Figure 9:
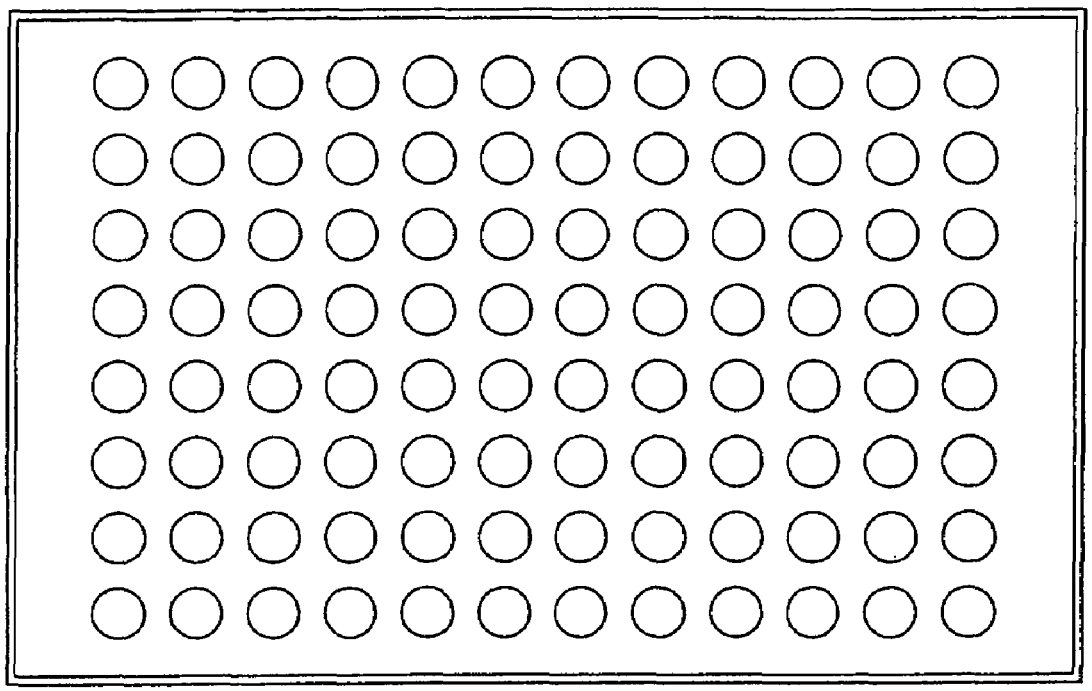
FIG. 9 shows a sample support according to the invention.

The device according to the invention is especially suitable for automatization using robots. Any number of sample vessels can be arranged on one sample support (96 samples are arranged in FIG. 9). FIG. 9 shows a top view of a sample support (1) according to the invention for the automated performance of the crystallization method having an elevated edge (2), sample vessels (16) and sections between the sample vessels (14).

The sample support is characterized by an elevated edge. This highly simplifies the robot-assisted performance of the method: The lower aqueous phase is added to each sample vessel. Thereafter, it is covered by a layer of the middle phase which preferably fills all sample vessels beyond the level of the indentation, but to below the edge of the individual sample vessels. This is followed by covering the whole system with a layer of the upper phase. This prevents interfering meniscus effects on the surface. Preferably, the device according to the invention has such a design that it can be used by current robot formats. This is the case, for example, if the sample support has 8 times 12 sample vessels with a pitch of 9 mm in a standard 96-well format. Standards like those of the Society of Biomolecular Sciences (SBS; www.sbsonline.org) are known to the skilled person.

The edge of the sample support is sufficiently high to accommodate the upper phase. Preferably, the proportion of the elevated edge in the total height of the sample support is from 2 to 50%, preferably from 5 to 30%, more preferably from 10 to 20%.

When the method is automated, the individual sample vessels can have subsections (indentations according to FIG. 10 or compartments according to FIGS. 12 and 13) separated by lateral walls. In a sample vessel, one or more such subsections can be present, for example, three indentations as in FIG. 7. A plurality of indentations and/or compartments may also be arranged beside a reservoir.

These embodiments according to the invention can save a number of operations, which highly facilitates the use thereof as an automated process. The automated performance of the method is similarly simple as that of batch methods according to the prior art, but it enables a dynamic setting of an end point and a metastable state. Further, time-shifted test methods on several proteins can be realized, in which the protein is added to an indentation into which the aqueous solution (fourth phase) was charged before. This enables a reduced consumption of chemicals and sample supports.

Before a three-phase system according to the invention is established, it is necessary to select the middle and upper phases to obtain neat phase boundaries and to provide the desired order of phases (lower/middle/upper) by adhesion and cohesion forces, inter alia.

The upper phase must have a lower density than that of the solution of the macromolecule and must have properties of inhibiting the diffusion of $H_2O$. Paraffin oil is suitable, in particular.

To test the middle phase, the individual liquids for the middle phase are respectively covered by a layer of an identical amount of the upper phase, followed by incubation at room temperature. Suitable liquids will form a phase boundary which is stable over an extended period of time.

To test the vapor permeability of the middle phase, the known crystallization of a macromolecule is examined in an open system with a lower aqueous solution of the macromolecule covered by a layer of the middle phase (without the upper phase). The diluted solution of the macromolecule is filtered, placed in a crystallization vessel and covered by the middle phase to be tested. Subsequently, the setup is observed over a period of several hours to several days. If the middle phase allows water molecules to diffuse out of the solution of the macromolecule, crystals form depending on the openness to diffusion and the layer thickness. If the middle phase does not allow the diffusion of water and therefore is not suitable according to the invention, no crystals will have formed after several days.

Since the solution of the macromolecule is mostly based on an electrolyte solution, it is additionally required to evaluate the behavior of the middle phase with respect to the aqueous phase to ensure that the liquid used for the middle phase is essentially non-miscible but compatible with the aqueous phase.

To test the influence of a middle phase open to diffusion on the diffusion-inhibiting properties of the upper phase, the system is additionally covered by a layer of paraffin oil which should be at least as thick as the layer of the middle phase. If the middle phase does not substantially influence the diffusion-inhibiting properties of the upper phase, formation of protein crystals cannot be observed, or at least it is significantly delayed.

EXAMPLES

Example 1

Test of the Solubility of the Middle Phase in the Upper Phase

Paraffin oil (Paraffin, low-viscosity, Merck; Ordering No.: 1.07174.1000) is used as the upper phase, and a compatible middle phase is searched. Instead of the paraffin oil, other liquids may be used which have a diffusion-inhibiting property and an appropriate density.

Table 1 contains an exemplary listing of the tested liquids which comprises different polysiloxanes, random copolymers and a block copolymer.

liquid X, this is no surprise, because it is polydimethylsiloxane (DMS) as used in the modified batch methods, which is added to the paraffin oil to render it more open to diffusion. Liquid X was contemplated in an exemplary manner.

Example 2

Test for Diffusion Properties of the Middle Phase

The middle phases to be tested are saturated with water. Thus, 5% (v/v) of water is added to the liquid to be tested, mixed, centrifuged and incubated for several days. The saturation served for preventing the formation of protein crystals by withdrawing water from the middle phase to be tested. Liquids XIII, XIV and XVI proved to be little compatible with an aqueous solution.

A lysozyme solution (25 mg/ml) is prepared as follows: 50 mg of lysozyme (Lysozyme, Sigma; Ordering No.: L-7651) is completely dissolved in 1 ml of water, filtered and admixed

TABLE 1

| | |
|---|---|
| I | Poly(dimethylsiloxane-co-methylphenylsiloxane), trimethylsilyl-terminated; phenylmethylsiloxane content: ~50%; viscosity at 25° C.: 100 mm$^2$/s (Silicone Oil AP100, Wacker-Chemie GmbH) |
| II | Poly(dimethylsiloxane-co-methylphenylsiloxane), trimethylsilyl-terminated; phenylmethylsiloxane content: ~50%; viscosity at 25° C.: 200 mm$^2$/s (Silicone Oil AP200, Wacker-Chemie GmbH) |
| III | Poly(dimethylsiloxane-co-methylphenylsiloxane), trimethylsilyl-terminated; phenylmethylsiloxane content: ~50%; viscosity at 25° C.: 500 mm$^2$/s (Silicone Oil AP500, Wacker-Chemie GmbH) |
| IV | Poly(dimethylsiloxane-co-methylphenylsiloxane), trimethylsilyl-terminated; phenylmethylsiloxane content: <50%; viscosity at 25° C.: 20 mm$^2$/s (Silicone Oil AR20, Wacker-Chemie GmbH) |
| V | Poly(dimethylsiloxane-co-methylphenylsiloxane), trimethylsilyl-terminated; phenylmethylsiloxane content: <50%; viscosity at 25° C.: 200 mm$^2$/s (Silicone Oil AR200, Wacker-Chemie GmbH) |
| VI | Poly(dimethylsiloxane-co-methylphenylsiloxane), trimethylsilyl-terminated; phenylmethylsiloxane content: <50%; viscosity at 25° C.: 1000 mm$^2$/s (Silicone Oil AR1000, Wacker-Chemie GmbH) |
| VII | Poly(dimethylsiloxane), hydroxy-terminated, about 25 cSt at 25° C. (Sigma Aldrich, Ordering No.: 48,193-9) |
| VIII | Poly(dimethylsiloxane), hydroxy-terminated, about 65 cSt at 25° C. (Sigma Aldrich, Ordering No.: 48,195-5) |
| IX | Poly(dimethylsiloxane), hydroxy-terminated, 90-150 cSt at 25° C. (Sigma Aldrich, Ordering No.: 48,297-0) |
| X | Poly(dimethylsiloxane), trimethylsilyl-terminated, Hampton Research, DMS Oil, Ordering No.: HR2-593 |
| XI | Poly(3,3,3-trifluoropropylmethylsiloxane), Hampton Research, FMS Oil, Ordering No.: HR2-595 |
| XII | ((N-Pyrrolidonepropyl)-methylsiloxane-dimethylsiloxane copolymer (ABCR, Ordering No.: YBD-125, Gelest Inc.) |
| XIII | Poly[dimethylsiloxane-co-methyl(3-hydroxypropyl)siloxane]-graft-poly(ethylene glycol) methyl ether (Sigma Aldrich, Ordering No.: 48,239-0) |
| XIV | Poly[dimethylsiloxane-co-methyl(3-hydroxypropyl)siloxane]-graft-poly(ethylene/propylene glycol) methyl ether (Sigma Aldrich, Ordering No.: 48,034-7) |
| XV | Poly[dimethylsiloxane-co-methyl(3,3,3-trifluoropropyl)siloxane] (Sigma Aldrich, Ordering No.: 48,257-9) |
| XVI | dimethylsiloxane-ethylene oxide block copolymer (ABCR, Ordering No.: DBE-224, Gelest Inc.) |

To round glass vessels having an interior diameter of 6.5 mm, 500 microliters each of the liquid to be tested are added, covered by 500 microliters each of paraffin oil and incubated at room temperature. Initially, all liquids form a sharp phase boundary towards the paraffin. After two hours, the phase boundary for liquids IV and X has already lost sharpness, caused by diffusion of the two liquids into one another. After 24 hours, this is partially also the case with liquid I. Thus, the liquids II, III, V, VI, VII, VIII, IX, XI, XII, XIII, XIV, XV and XVI are potential candidates for the middle phase of the method described herein. The liquids IV, X and conditionally I are rejected from the selection process presented here. For with 1 ml of the following solution: 50% NaCl, 100 mM NaOAc, pH 4.0, 0.020% NaN$_3$.

Into a 96-well microtitration plate, 10 microliters of the lysozyme solution is charged per sample vessel and covered by 80 microliters each of liquid Nos. II, III, V, VI, VII, VIII and IX as mentioned in Example 1. Duplicate setups are prepared and further covered by 100 microliters of paraffin oil. Both setups are incubated at 22° C. and observed over a period of several weeks. In the selection of the liquids to be tested, less expensive potential liquids were chosen.

The following table states the times in days after which lysozyme crystals could be observed:

| Liquid No. | without paraffin oil | with paraffin oil |
| --- | --- | --- |
| II | ~8 | ~22 |
| III | ~8 | ~22 |
| V | ~6 | ~22 |
| VI | ~7 | ~22 |
| VII | ~0.5 | ~22 |
| VIII | ~1 | ~22 |
| IX | ~1 | ~22 |

Thus, different diffusion properties of the liquids can be characterized and their influence on the diffusion properties of the paraffin oil excluded.

Example 3

Diffusion Properties of the Hydroxy-terminated Polydimethylsiloxanes

Instead of the microtitration plates mentioned in Example 2, glass vessels having an interior diameter of 6.5 mm are used and filled with 100 microliters of liquid Nos. VII, VIII or IX as mentioned in Example 1. Duplicate setups are prepared and further covered by 100 microliters of paraffin oil. Subsequently, 5 microliters of the lysozyme solution as described in Example 2 is added to the glass tubes. It migrates to the bottom of the vessel. Within a few hours, a slight turbidity in liquid VII is observed in the setup covered by paraffin. After several hours, such turbidity is also visible in liquids VIII and IX covered by paraffin oil. Such turbidity fails to occur in the setups not covered with paraffin oil. If no aqueous phase is added to the setups covered by paraffin oil, turbidity is not observed. If pure water is used instead of the lysozyme solution, a similar behavior is observed. The saturation of the liquids as performed according to Example 2 is particularly important for the hydroxy-terminated dimethylsiloxanes.

Example 4

Crystallization of Lysozyme in a Four-phase System

Structure of the four-phase system: As the lower phase, 500 microliters each of a solution of 50% NaCl, 100 mM NaOAc, pH 4.0, 0.020% $NaN_3$, is added to glass vessels with interior diameters of 6.5 mm. Thus, the solution determines the end point for the crystallization of the lysozyme. Subsequently, 100 microliters of liquid No. V as mentioned in Example 1 is added as the middle phase. The whole is covered by 100 microliters of paraffin oil as the upper phase.

One microliter of a lysozyme solution according to Example 2 is applied into the three-phase system below the paraffin/air phase boundary by means of a pipette and migrates to the silicone oil/paraffin oil phase boundary due to the difference in density. Subsequently, the protein solution slowly migrates to the lower phase/silicone oil phase boundary and usually remains there as a stable fourth phase in the form of a drop. The end point of the concentration is determined by the composition of the lower phase. Occasionally, an undesirable unification of the fourth phase with the lower phase is observed. Protein crystals are formed (FIG. 4). If liquid VI is used instead of liquid V, the drop will usually stabilize at the paraffin oil/silicone oil phase boundary. This applies to drops of <1 microliter, in particular. Protein crystals are also formed.

Liquid Nos. V and VI as mentioned in this Example are copolymers. They are different in viscosity and thus in the length distribution of the respective polymer chains. Thus, it is evident that the length and length distribution of the phenylmethylsiloxane as well as the volume of the protein solution have a significant influence on the behavior of the system. Depending on the application, these parameters can be adjusted and optimized. The system may also be further optimized by the use of additives (e.g., stabilizers, block copolymers, especially di- and/or triblock copolymers).

If glass tubes or glass capillaries are used, the birefringence of the protein crystals can be used for detection. Thus, polarized light is subjected to total extinction using an analyzer shifted by 90°, wherein crystals of non-cubic symmetry show a light signal depending on their orientation (FIG. 5). The portion of the sample vessel through which the light path goes must be optically homogeneous. In the device according to FIG. 5, the measurement was performed through the lateral walls. Especially for sample supports with a multitude of sample vessels, it is advantageous to perform the measurement through an optically homogeneous bottom of the vessel. Further, when glass is used, a concave meniscus is formed at the lower/middle and middle/upper phase boundaries, which results in a centered position of the drop (see FIG. 4). This is of advantage for the analysis of the crystallization experiments. In this way, the surface properties of the vessel can be selected to beneficially affect the method.

Example 5

Crystallization in a Four-phase System with Remote Separation of the Protein solution from the lower phase A three-phase system is established in a 96-well crystallization plate (Greiner Bio-One, Protein crystallization plate, 96 well; Ordering No. 609120) as described above. It is important that the lower phase does not extend beyond the indentation (see FIG. 6). The middle phase is then applied until the whole section of a sample position is covered. Subsequently, covering with paraffin oil is performed (upper phase, see FIG. 6). The middle phase may also be applied after the upper phase.

The following volumes are considered as guidelines: 300 microliters of precipitation reagent (see lower phase, Example 4), 90 microliters of middle phase, 120 microliters of paraffin oil, and 2 microliters of protein solution.

The requirements demanded from the middle phase with respect to the stabilization of the protein drop are less stringent than those in Example 4. Two microliters of a lysozyme solution as described in Example 2 is applied to be positioned in or migrate to the indentation of the vessel. It forms a drop which is surrounded by the middle phase and the vessel wall. FIG. 7 shows a crystallization experiment in which the liquid IX was used as the middle phase. Protein crystals form in the case of liquid IX after two days. When the hydroxy-terminated polysiloxanes (liquids VII, VIII and IX) are used, a disruption of the upper paraffin layer can often be observed, especially if lower volumes of the paraffin oil are used. However, the crystallization plate used here does not allow larger amounts of paraffin oil to be applied. In contrast, the use of a sample support with an elevated edge allows for the application of a sufficient layer of paraffin oil over the entire sample support.

Example 6

Comparative Crystallization of Further Enzymes: Glucose Isomerase and Xylanase The method was realized by means of two commercially available enzymes, namely glucose isomerase (Hampton Research, Glucose Isomerase, Ordering No.: HR7-100) and xylanase (Hampton Research, Xylanase, Ordering No.: HR7-106). Both proteins were tested at a concentration of 15 mg/ml as well as by means of an established and commercially available kit of precipitation reagents (Hampton Research, crystal screen, HR2-110) (according to Jancarik, J., und Kim, S. H.; Sparse matrix sampling;: a screening method for crystallization of proteins; J. Appl. Cryst. 1991, 24, 409-11). The precipitation reagents were used both undiluted and in 50% dilution. The protein solution was filtered.

Figure 8:
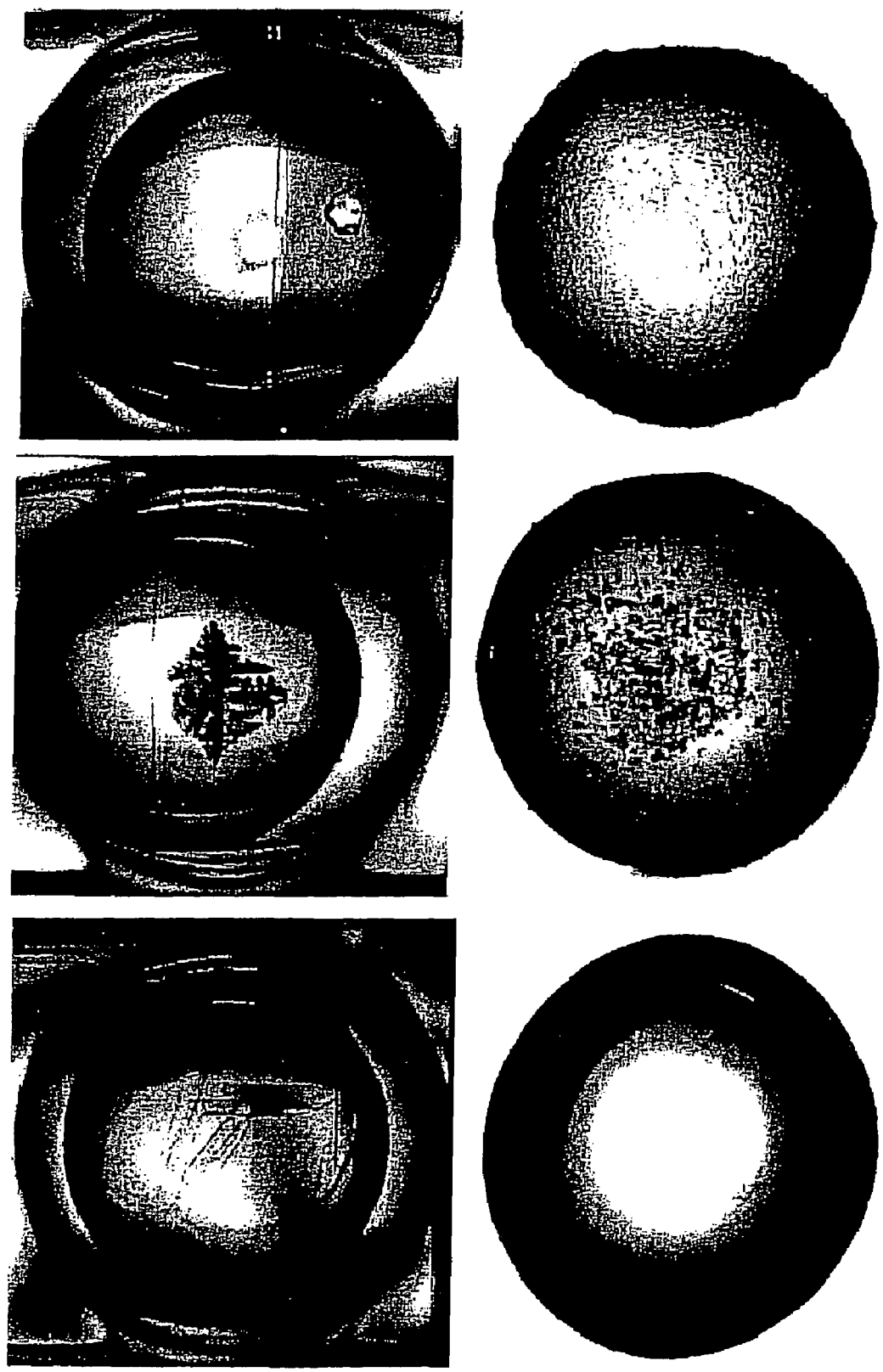
FIG. 8 shows a comparison of different conditions for glucose isomerase and xylanase as examples.

A three-phase system is realized in a 96-well crystallization plate equipped with an elevated edge (Greiner Bio-One, Protein crystallization plate, 96 well; Ordering No. 609120). The edge was generated by adhesively bonding a plastic strip of ~2 cm and sealed with hot-melt adhesive. The three-phase system is established by first applying paraffin oil over the entirety of the sample supports, followed by adding the different precipitation reagents individually to a reservoir each. Subsequently, a drop of the precipitation reagent with a volume of 1.5 µl is pipetted from the reservoir into each of three indentations. Then, phase II is applied by adding as much liquid VIII from Example 1 as needed until the whole section of each sample position is covered, but not beyond the edge of the sample position. The plate is subsequently incubated for two hours. Subsequently, 1.5 µl of the aqueous protein solution is added to each indentation. In parallel with this experiment, a classical hanging drop experiment is set up. After 18 hours, pictures of the setups were taken. FIG. 8 shows a comparison between the method of the three-phase system and the hanging drop. In more than 50% of the instances, the method of the three phases clearly shows better formed crystals. Further, it could be shown that the structure of the three-phase system using liquid VIII from Example 1 is compatible with all the 50 solutions of the screen. The precipitation reagents consist of a selection of substances typically used in protein crystallization and also comprise organic solvents.

FIG. 8 shows by the example of three conditions a comparison of the results generated in Example 6 between the novel methods (left column) and the classical hanging drop method (right column). The first and second rows give results of glucose isomerase, and the last row gives a result of xylanase. The examples shown here demonstrate, that better results are often obtained from the novel method as compared with classical methods.

The invention claimed is:

1. A method for the crystallization of macromolecules in a three-phase system using a vessel containing a lower aqueous phase, a middle liquid phase and an upper hydrophobic phase having a lower density than that of the lower aqueous phase, the method comprising:

adding an aqueous solution of the macromolecules to the middle phase to form a fourth phase, followed by incubation, wherein said aqueous solution of macromolecules forms a fourth phase which does not immediately mix with the lower phase;

said fourth phase does not mix completely with the lower phase until the crystallization begins in the fourth phase or at a phase boundary with the fourth phase;

there is essentially no diffusion of water from the vessel through the upper phase over the duration of the crystallization process; and said middle phase is selected to have a diffusion of water from the fourth phase into the lower phase.

2. The method according to claim 1, characterized in that said aqueous lower phase has been replaced by a hygroscopic solid phase.

3. The method according to claim 1, characterized in that said lower phase is a hygroscopic liquid phase.

4. The method according to claim 1, characterized in that said fourth phase migrates to the phase boundary between the lower and middle phases or to the phase boundary between the middle and upper phases after having been introduced into the vessel.

5. The method according to claim 1, characterized in that the vessel is designed in such a way that the fourth phase does not come into contact with the lower phase.

6. The method according to claim 5, characterized in that said fourth phase is located in an indentation.

7. The method according to claim 1, characterized in that said upper phase contains paraffin oil.

8. The method according to claim 1, characterized in that said middle phase contains hydroxy-terminated polydimethylsiloxane and/or phenylmethylsilicone oil.

9. The method according to claim 1, characterized in that said lower aqueous phase contains salts, buffer substances, polymers and/or organic solvents.

10. The method according to claim 1, characterized in that said solution of the macromolecule contains salts, buffer substances, polymers and/or organic solvents.

11. The method according to claim 1, characterized in that said macromolecules are proteins, DNA, RNA, complexes of macromolecules, protein complexes, protein/ligand complexes, DNA/ligand complexes, protein/RNA complexes, protein/DNA complexes, viruses or viral fragments.

12. The method according to claim 1, further comprising analyzing or continuously monitoring the crystallization by optical measuring methods.

13. The method according to claim 1, wherein the crystallization is automated.

14. The method of according to claim 1 further comprising automated screening of the crystallized macromolecules.

15. The method according to claim 12 wherein the analyzing or monitoring of the crystallization is performed by a method selected from the group consisting microphotographs, light scattering methods and spectroscopic methods.

* * * * *